United States Patent
Endo et al.

(10) Patent No.: US 11,686,786 B2
(45) Date of Patent: Jun. 27, 2023

(54) MAGNETIC SENSOR

(71) Applicant: SHOWA DENKO K.K., Tokyo (JP)

(72) Inventors: Daizo Endo, Ichihara (JP); Akira Sakawaki, Ichihara (JP)

(73) Assignee: SHOWA DENKO K.K., Tokyo (JP)

(*) Notice: Subject to any disclaimer, the term of this patent is extended or adjusted under 35 U.S.C. 154(b) by 0 days.

(21) Appl. No.: 17/526,159

(22) Filed: Nov. 15, 2021

(65) Prior Publication Data
US 2022/0206087 A1   Jun. 30, 2022

(30) Foreign Application Priority Data

Dec. 25, 2020   (JP) .................................. 2020-217868

(51) Int. Cl.
*G01R 33/06* (2006.01)

(52) U.S. Cl.
CPC .................................. *G01R 33/063* (2013.01)

(58) Field of Classification Search
CPC ............... G01R 33/00; G01R 33/0035; G01R 33/0023; G01R 33/0017; G01R 31/3191; G01R 33/063; G01B 7/004; G01C 17/38; G06F 3/017; G06F 3/0346; G06F 3/012
See application file for complete search history.

(56) References Cited

U.S. PATENT DOCUMENTS

| 2010/0156405 A1* | 6/2010 | Furukawa | .............. B82Y 25/00 |
| | | | 324/252 |
| 2015/0028863 A1* | 1/2015 | Zeyen | ................ G01R 33/0011 |
| | | | 29/602.1 |

FOREIGN PATENT DOCUMENTS

| EP | 3640659 A1 * | 4/2020 | ......... G01R 33/0052 |
| JP | 2008-249406 A | 10/2008 | |

* cited by examiner

*Primary Examiner* — Jermele M Hollington
*Assistant Examiner* — Taqi R Nasir
(74) *Attorney, Agent, or Firm* — Sughrue Mion, PLLC (57) ABSTRACT

It is aimed at improving sensitivity of a magnetic sensor using the magnetic impedance effect. A magnetic sensor includes: a non-magnetic substrate; and a sensitive element including a soft magnetic material layer composed of an amorphous alloy with an initial magnetic permeability of 5,000 or more, the soft magnetic material layer being provided on the substrate, having a longitudinal direction and a short direction, being provided with uniaxial magnetic anisotropy in a direction crossing the longitudinal direction, and sensing a magnetic field by a magnetic impedance effect.

7 Claims, 4 Drawing Sheets

MAGNETIC SENSOR

CROSS REFERENCE TO RELATED APPLICATIONS

This application is based on and claims priority under 35 USC § 119 to Japanese Patent Application No. 2020-217868 filed Dec. 25, 2020, the disclosure is incorporated herein by reference in its entirety.

BACKGROUND

Technical Field

The present invention relates to a magnetic sensor.

Related Art

As a related art described in a gazette, there is a magnetic impedance effect element including: a thin film magnet configured with a hard magnetic material film formed on a non-magnetic substrate; an insulating layer covering the top of the thin film magnet; and a magneto-sensitive part formed on the insulating layer and configured with one or plural rectangular soft magnetic material films provided with uniaxial anisotropy (refer to Japanese Patent Application Laid-Open Publication No. 2008-249406).

By the way, the magnetic sensor provided with a sensitive element that senses the magnetic field by a magnetic impedance effect uses the change in the impedance with respect to the magnetic field. The change in the impedance is caused by a change in the skin depth associated with a change in magnetic permeability by a magnetic field in a magnetic thin film. Consequently, to improve sensitivity of the magnetic sensor, it is required to increase the change in the magnetic permeability of the sensitive element that generates the magnetic impedance effect.

An object of the present invention is to improve sensitivity of a magnetic sensor using the magnetic impedance effect.

SUMMARY

A magnetic sensor to which the present invention is applied includes: a non-magnetic substrate; and a sensitive element including a soft magnetic material layer composed of an amorphous alloy with an initial magnetic permeability of 5,000 or more, the soft magnetic material layer being provided on the substrate, having a longitudinal direction and a short direction, being provided with uniaxial magnetic anisotropy in a direction crossing the longitudinal direction, and sensing a magnetic field by a magnetic impedance effect.

Here, the soft magnetic material layer may have an initial magnetic permeability of 10,000 or more.

Moreover, the soft magnetic material layer may be an amorphous alloy mainly composed of Co and also containing Fe, Si, B, and Mn.

Alternatively, the soft magnetic material layer may be an amorphous alloy mainly composed of Co and also containing Fe, Si, B, Mn, and Cr.

In such a magnetic sensor, the sensitive element may include the plural soft magnetic material layers, and the sensitive element may also include a magnetic domain suppression layer between the soft magnetic material layers, the magnetic domain suppression layer suppressing occurrence of a closure magnetic domain in the soft magnetic material layers.

In addition, in such a magnetic sensor, the sensitive element may include the plural soft magnetic material layers, and the sensitive element may also include a non-magnetic conductor layer between the soft magnetic material layers, the conductor layer having higher conductivity than the soft magnetic material layers.

Then, in such a magnetic sensor, the sensitive element may include the plural soft magnetic material layers, and the sensitive element may also include a non-magnetic antiferromagnetically coupling layer between the soft magnetic material layers, the antiferromagnetically coupling layer antiferromagnetically coupling the soft magnetic material layers.

According to the present invention, it is possible to improve sensitivity of a magnetic sensor using the magnetic impedance effect.

BRIEF DESCRIPTION OF THE DRAWINGS

An exemplary embodiment of the present invention will be described in detail based on the following figures, wherein:

FIGS. 1A and 1B illustrate a specific example of a magnetic sensor to which the exemplary embodiment is applied, where

FIG. 3A shows the sensitivity, and FIG. 3B shows the anisotropic magnetic field; and FIGS. 4A to 4C show cross-sectional views of modified examples of the magnetic sensor, where

DETAILED DESCRIPTION

Hereinafter, with reference to attached drawings, an exemplary embodiment of the present invention (in the following, referred to as the exemplary embodiment) will be described.

Configuration of Magnetic Sensor 1

Figure 1A:
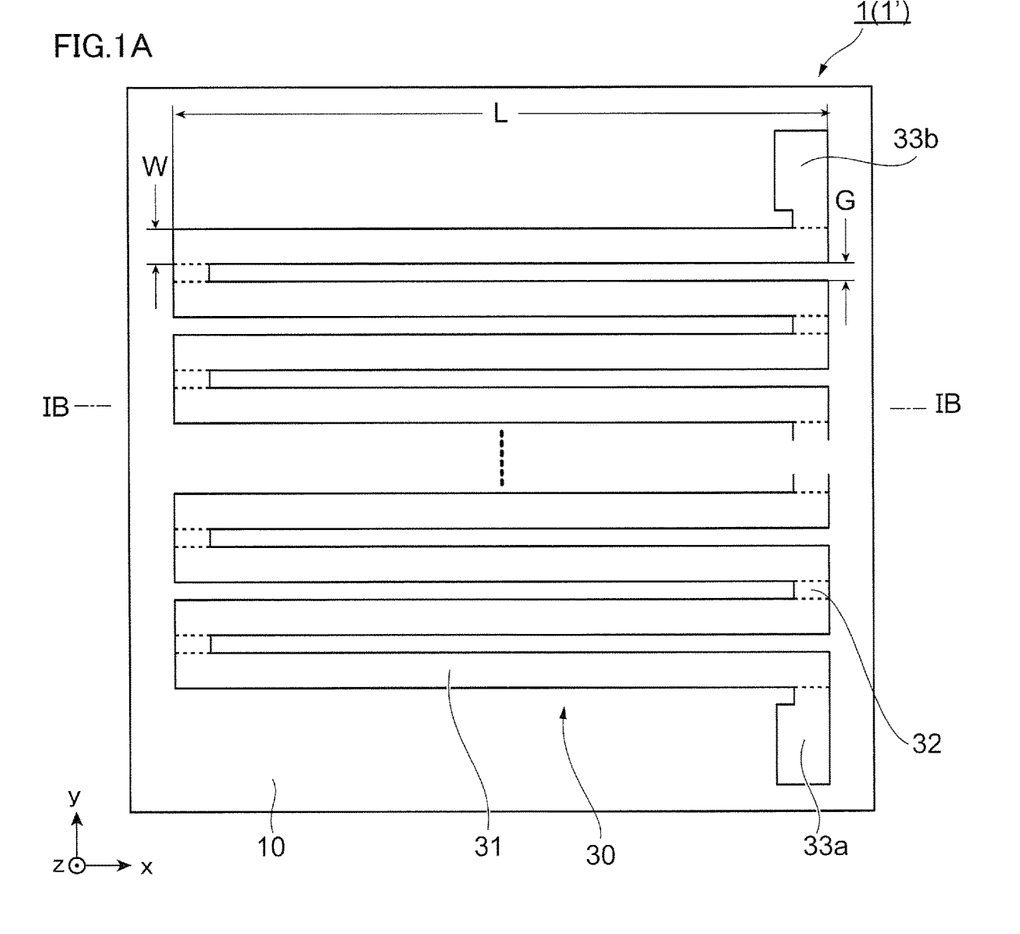
FIG. 1A is a plan view and FIG. 1B is a cross-sectional view along the IB-IB line in FIG. 1A.
Figure 1B:
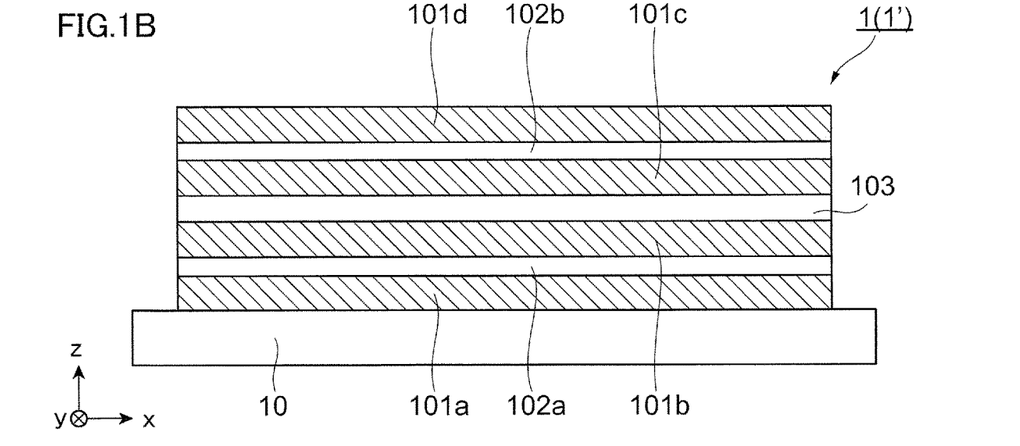

FIGS. 1A and 1B illustrate a specific example of a magnetic sensor 1 to which the exemplary embodiment is applied. FIG. 1A is a plan view and FIG. 1B is a cross-sectional view along the IB-IB line in FIG. 1A. In FIG. 1A, it is assumed that the right direction of the page is the x direction, the upward direction of the page is the y direction, and the front side direction of the page is the z direction. In FIG. 1B, it is assumed that the right direction of the page is the x direction, the upward direction of the page is the z direction, and the backside direction of the page is the y direction.

As shown in FIG. 1B, the magnetic sensor 1, to which the exemplary embodiment is applied, includes: a non-magnetic substrate 10; and a sensitive element 30 provided on the substrate 10 and including a soft magnetic material layer that senses the magnetic field.

Note that the cross-sectional structure of the magnetic sensor 1 shown in FIG. 1B will be described in detail later.

Here, the soft magnetic material has a small, so-called coercive force, the soft magnetic material being easily magnetized by an external magnetic field, but, upon removal of the external magnetic field, quickly returning to a state with no magnetization or a little magnetization. Note that the hard magnetic material has a large, so-called coercive force, the hard magnetic material being once magnetized by an external magnetic field, even upon removal of the external magnetic field, maintaining the magnetized state.

Description will be given of a planar structure of the magnetic sensor 1 by FIG. 1A. The magnetic sensor 1 has a quadrangular planar shape as an example. The planar shape of the magnetic sensor 1 is several millimeters square. For example, the length in the x direction is 4 mm to 6 mm, and the length in the y direction is 3 mm to 5 mm. Note that the size of the planar shape of the magnetic sensor 1 may be other values.

Here, the sensitive element 30 provided on the substrate 10 will be described. The sensitive element 30 includes plural sensitive parts 31 each having a reed-shaped planar shape with a longitudinal direction and a short direction. In FIG. 1A, the x direction is the longitudinal direction of the sensitive element 30. The plural sensitive parts 31 are arranged so that the longitudinal directions thereof are in parallel with one another. The sensitive element 30 includes: connection parts 32 windingly connecting the adjacent sensitive parts 31 in series; and terminal parts 33 to which electric wires are connected to supply electrical current. The sensitive parts 31 sense the magnetic field or the change in the magnetic field and generate the magnetic impedance effect. In other words, the magnetic field or change in the magnetic field is measured based on the change in the impedance of the sensitive element 30 in which the sensitive parts 31 are connected in series. Hereinafter, the impedance of the sensitive element 30 is sometimes referred to as the impedance of the magnetic sensor 1.

FIG. 1A shows eight sensitive parts 31, but the number of sensitive parts 31 does not have to be eight. Therefore, FIG. 1A provides a broken line between the four sensitive parts 31 on the upper side of the page and the four sensitive parts 31 on the lower side of the page, to thereby indicate that the number of sensitive parts 31 is not limited to eight.

The connection part 32 is provided between end portions of the adjacent sensitive parts 31 and windingly connects the adjacent sensitive parts 31 in series.

The terminal parts 33 (the terminal parts 33a and 33b) are provided to the two respective end portions of the sensitive parts 31, the end portions not being connected to the connection parts 32. The terminal part 33 functions as a pad part that connects electric wires for supplying the electrical current. The terminal part 33 may have a size capable of connecting the electric wires. Note that the terminal parts 33 (the terminal parts 33a and 33b) are provided on the right side in the page of FIG. 1A, but the terminal parts 33 may be provided on the left side or may be provided to be divided on the left and right.

Here, suppose that the length of the sensitive part 31 in the longitudinal direction (the x direction) is the length L. Then, suppose that the width of the sensitive part 31 in the short direction is the width W. The spacing between the adjacent sensitive parts 31 is supposed to be the spacing G. In the sensitive parts 31, the length L is, for example, 1 mm to 10 mm, the width W is, for example, 10 μm to 150 μm, and the spacing G is, for example, 10 μm to 150 μm. Note that the size of each sensitive part 31 (the length L, the width W, the thickness, etc.), the number of sensitive parts 31, the spacings G between the sensitive parts 31, or the like may be set in accordance with the magnitude of the magnetic field to be sensed, in other words, to be measured. Note that the number of the sensitive parts 31 may be one.

Next, with reference to FIG. 1B, the cross-sectional structure of the magnetic sensor 1 will be described.

The substrate 10 is composed of a non-magnetic material; for example, an oxide substrate, such as glass or sapphire, a semiconductor substrate, such as silicon, or a metal substrate, such as aluminum, stainless steel, or a nickel-phosphorus-plated metal, can be provided. Note that, in the case where the substrate 10 has high conductivity, an insulating material layer to electrically insulate the substrate 10 from the sensitive element 30 may be provided on the surface of the substrate 10 on which the sensitive element 30 is to be provided. Specific examples of the insulating material constituting the insulating material layer include oxide, such as $SiO_2$, $Al_2O_3$, or $TiO_2$, or nitride, such as $Si_3N_4$ or MN. Here, description will be given on the assumption that the substrate 10 is made of glass.

The sensitive element 30 includes, as a specific example, four soft magnetic material layers 101a, 101b, 101c, and 101d from the substrate 10 side. Then, the sensitive element 30 includes, between the soft magnetic material layer 101a and the soft magnetic material layer 101b, a magnetic domain suppression layer 102a that suppresses occurrence of a closure magnetic domain in the soft magnetic material layer 101a and the soft magnetic material layer 101b. Further, the sensitive element 30 includes, between the soft magnetic material layer 101c and the soft magnetic material layer 101d, a magnetic domain suppression layer 102b that suppresses occurrence of a closure magnetic domain in the soft magnetic material layer 101c and the soft magnetic material layer 101d. Also, the sensitive element 30 includes, between the soft magnetic material layer 101b and the soft magnetic material layer 101c, a conductor layer 103 that reduces resistance (here, refer to the electrical resistance) of the sensitive element 30. In the case where the soft magnetic material layers 101a, 101b, 101c, and 101d are not distinguished, the layers are referred to as the soft magnetic material layers 101. In the case where the magnetic domain suppression layers 102a and 102b are not distinguished, the layers are referred to as the magnetic domain suppression layers 102.

The soft magnetic material layer 101 is configured with a soft magnetic material of an amorphous alloy showing the magnetic impedance effect. The thickness of the soft magnetic material layer 101 is, for example, 100 nm to 1 μm. In the sensitive element 30 to which the exemplary embodiment is applied, the soft magnetic material layer 101 is the soft magnetic material with the initial permeability μi of 5,000 or more. The soft magnetic material layer 101 will be described in detail later.

Note that, in this specification, amorphous alloys and amorphous metals refer to those having structures that do not have a regular arrangement of atoms such as crystals, which are formed by the sputtering method, etc.

The magnetic domain suppression layer 102 suppresses occurrence of the closure magnetic domain in the upper and lower soft magnetic material layers 101 that sandwich the magnetic domain suppression layer 102.

In general, in the soft magnetic material layer 101, plural magnetic domains with different directions of magnetization are likely to be formed. In this case, a closure magnetic domain showing annular-shaped magnetization direction is formed. As the external magnetic field is increased, the magnetic domain walls are displaced; thereby the area of the magnetic domain with the magnetization direction that is the same as the direction of the external magnetic field is increased, whereas the area of the magnetic domain with the magnetization direction that is opposite to the direction of the external magnetic field is decreased. Then, in the magnetic domain where the magnetization direction is different from the direction of the external magnetic field, magnetization rotation is generated so that the magnetization direction is the same as the direction of the external magnetic field. Finally, the magnetic domain wall that existed between the adjacent magnetic domains disappears and the adjacent magnetic domains become a magnetic domain (a single magnetic domain). In other words, when the closure magnetic domain is formed, as the external magnetic field changes, the Barkhausen effect, in which the magnetic domain walls constituting the closure magnetic domain are displaced in a stepwise and discontinuous manner, is generated. The discontinuous displacement of the magnetic domain walls results in noise in the magnetic sensor 1, which causes a risk of reduction in S/N in the output obtained from the magnetic sensor 1. The magnetic domain suppression layer 102 suppresses formation of plural magnetic domains with small areas in the soft magnetic material layers 101 provided on upper and lower sides of the magnetic domain suppression layer 102. This suppresses the formation of the closure magnetic domain and suppresses the noise generated by discontinuous displacement of the magnetic domain walls. Note that, in the case where the magnetic domain suppression layer 102 is provided, it is better to have less magnetic domains to be formed, that is, large-sized magnetic domains, as compared to the case where the magnetic domain suppression layer 102 is not provided.

Specific examples of materials of such a magnetic domain suppression layer 102 include non-magnetic materials, such as Ru and $SiO_2$, and non-magnetic amorphous metals, such as CrTi, AlTi, CrB, CrTa, and CoW. The thickness of such a magnetic domain suppression layer 102 is, for example, 10 nm to 100 nm.

The conductor layer 103 reduces the resistance of the sensitive element 30. In other words, the conductor layer 103 has conductivity higher than that of the soft magnetic material layer 101, and reduces the resistance of the sensitive element 30, as compared to the case where the conductor layer 103 is not included. The magnetic field or change in the magnetic field caused by the sensitive element 30 is measured by the change in the impedance (hereinafter, the impedance is referred to as the impedance Z, and the change in the impedance Z is referred to as ΔZ) when the alternating current is passed between the two terminal parts 33a and 33b. On this occasion, as the frequency of the alternating current is higher, the rate of change in the impedance Z with respect to the change in the external magnetic field (hereinafter, the change in the external magnetic field is referred to as ΔH, and the rate of change in the impedance Z with respect to ΔH is referred to as the impedance change rate ΔZ/ΔH) is increased. However, if the frequency of the alternating current is increased without including the conductor layer 103, the impedance change rate ΔZ/ΔH is reduced by the floating capacitance in the state of the magnetic sensor 1. In other words, assuming that the resistance of the sensitive element 30 is R, the floating capacitance is C, and the sensitive element 30 is the parallel circuit of the resistance R and the floating capacitance C, the relaxation frequency $f_0$ of the magnetic sensor 1 can be represented by Expression (1).

[Math. 1]

$$f_0 = \frac{1}{2\pi RC} \quad (1)$$

As can be seen from Expression (1), when the floating capacitance C is large, the relaxation frequency $f_0$ is small; when the frequency of the alternating current is higher than the relaxation frequency $f_0$, the impedance change rate ΔZ/ΔH is reduced conversely. Therefore, the conductor layer 103 is provided for reducing the resistance R of the sensitive element 30, to thereby increase the relaxation frequency $f_0$.

As such a conductor layer 103, it is preferable to use metal or an alloy having high conductivity, and is more preferable to use metal or an alloy that is highly conductive and non-magnetic. Specific examples of materials of such a conductor layer 103 include metal, such as Al, Cu, and Ag. The thickness of the conductor layer 103 is, for example, 10 nm to 1 μm. It is sufficient that the conductor layer 103 can reduce the resistance of the sensitive element 30, as compared to the case where the conductor layer 103 is not included.

Note that the upper and lower soft magnetic material layers 101 sandwiching the magnetic domain suppression layer 102 and the upper and lower soft magnetic material layers 101 sandwiching the conductor layer 103 are antiferromagnetically coupled (AFC) with each other. Due to the upper and lower soft magnetic material layers 101 that are antiferromagnetically coupled, occurrence of demagnetizing fields is suppressed and the sensitivity of the magnetic sensor 1 is improved.

The magnetic sensor 1 is manufactured as follows.

First, on the substrate 10, a photoresist pattern to cover portions of the surface of the substrate 10 excluding the planar shape of the sensitive element 30 is formed by using the photolithography technique that is publicly known. Subsequently, on the substrate 10, the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d are deposited in this order by, for example, the sputtering method. Then, the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d deposited on the photoresist are removed with the photoresist. Consequently, on the substrate 10, a laminated body configured with the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d processed into the planar shape of the sensitive element 30 is left. In other words, the sensitive elements 30 are formed.

The soft magnetic material layer 101 is provided with uniaxial magnetic anisotropy in a direction crossing the longitudinal direction, for example, the short direction (the y direction in FIG. 1A). Note that the direction crossing the longitudinal direction may have an angle more than 45° and not more than 90° with respect to the longitudinal direction. The uniaxial magnetic anisotropy can be imparted by performing, for example, the heat treatment at 400° C. in a rotating magnetic field of 3 kG (0.3 T) (heat treatment in the rotating magnetic field) and the heat treatment at 400° C. in a static magnetic field of 3 kG (0.3 T) (heat treatment in the static magnetic field) subsequent thereto on the sensitive element 30 formed on the substrate 10. Impartation of the uniaxial magnetic anisotropy may be performed in depositing the soft magnetic material layer 101 constituting the sensitive part 30 by use of a magnetron sputtering method, instead of being performed in the heat treatment in the rotating magnetic field and heat treatment in the static magnetic field. In other words, by the magnetic field formed by the magnets used in the magnetron sputtering method, the soft magnetic material layer 101 is deposited, and at the same time, the uniaxial magnetic anisotropy is imparted to the soft magnetic material layer 101.

In the manufacturing method described above, the connection parts 32 and the terminal parts 33 are simultaneously formed integrally with the sensitive parts 31. Note that the connection parts 32 and the terminal parts 33 may be formed with a metal having conductivity, such as Al, Cu, or Ag. In addition, the metal having conductivity, such as Al, Cu, or Ag, may be laminated on the connection parts 32 and the terminal parts 33 simultaneously formed integrally with the sensitive parts 31.

Action of Sensitive Element 30

The action of the sensitive element 30 will be described.

Figure 2:
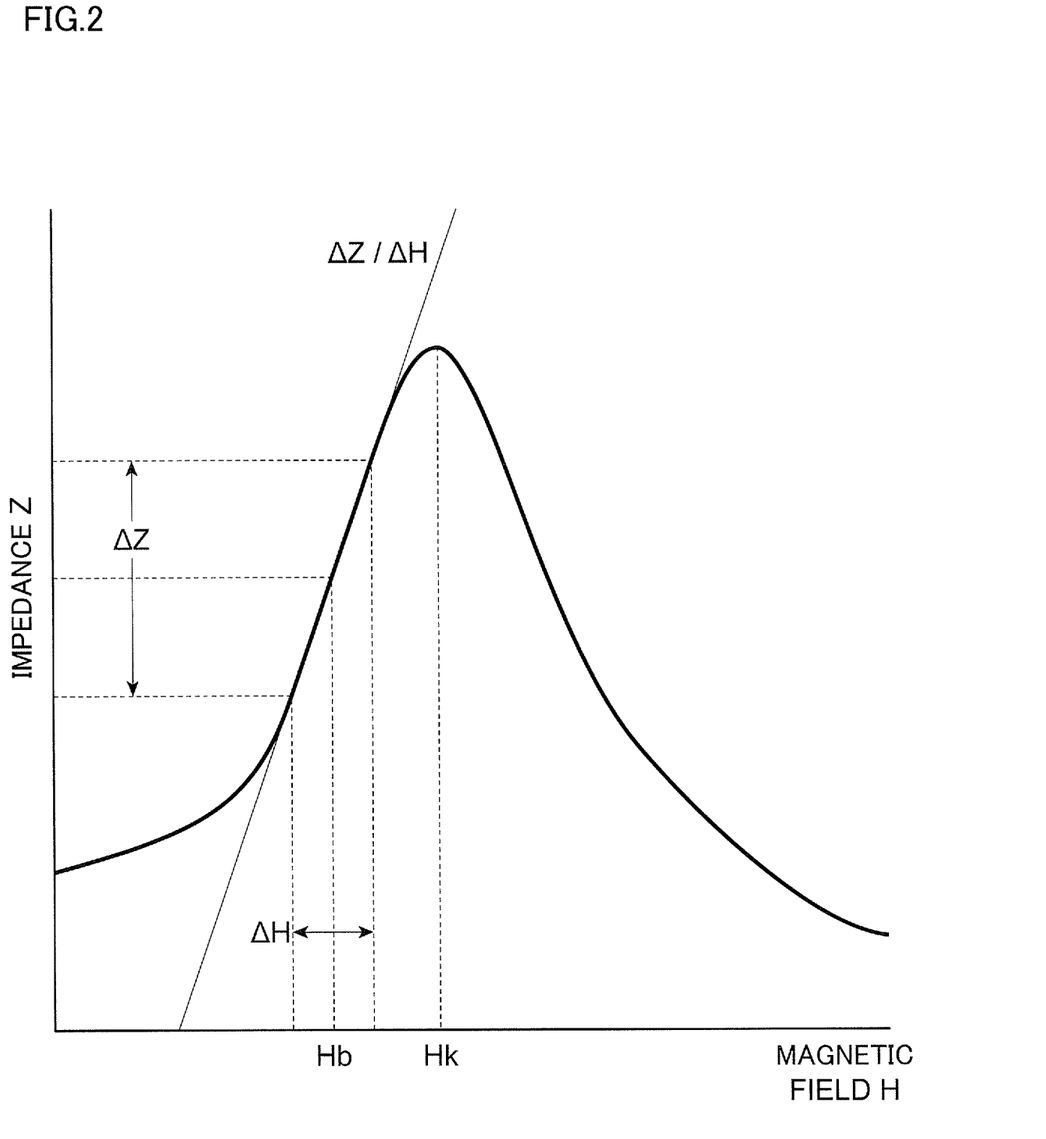
FIG. 2 illustrates a relation between a magnetic field applied in the longitudinal direction of a sensitive part in a sensitive element and an impedance Z of the sensitive element.

FIG. 2 illustrates a relation between the magnetic field H applied in the longitudinal direction of the sensitive part 31 of the sensitive element 30 (the x direction in FIG. 1A) and an impedance Z of the sensitive element 30. In FIG. 2, the horizontal axis indicates the magnetic field H, and the vertical axis indicates the impedance Z. Note that the impedance Z is measured by passing the alternating current between the terminal parts 33a and 33b of the sensitive element 30 shown in FIG. 1A.

As shown in FIG. 2, the impedance Z of the sensitive element 30 is increased as the magnetic field H applied in the longitudinal direction of the sensitive parts 31 is increased. Then, when the magnetic field H to be applied becomes larger than the anisotropic magnetic field Hk, the impedance Z of the sensitive element 30 is reduced conversely. Within the range smaller than the anisotropic magnetic field Hk, by use of a portion where the amount of change $\Delta Z$ in the impedance Z with respect to the amount of change $\Delta H$ in the magnetic field H is steep, namely, a portion where the impedance change rate $\Delta Z/\Delta H$ is steep (large), it is possible to extract extremely weak change in the magnetic field H as the amount of change $\Delta Z$ in the impedance Z. In FIG. 2, the center of the magnetic field H where the impedance change rate $\Delta Z/\Delta H$ is large is shown as the magnetic field Hb. In other words, it is possible to measure the amount of change $\Delta H$ in the magnetic field H in the vicinity to the magnetic field Hb (the range indicated by arrows in FIG. 2) with high accuracy. Here, the portion where the amount of change $\Delta Z$ in the impedance Z is the steepest (the impedance change rate $\Delta Z/\Delta H$ is the largest), that is, the amount of change Zmax of the impedance per unit magnetic field in the magnetic field Hb divided by the impedance Z in the magnetic field Hb (the impedance Z in the magnetic field Hb is referred to as the impedance Zb) is the sensitivity (Zmax/Zb). As the sensitivity Zmax/Zb is higher, the magnetic impedance effect becomes larger and the magnetic field or change in the magnetic field can be easily measured. To put it another way, the sensitivity Zmax/Zb becomes higher as the change in the impedance Z with respect to the magnetic field H are steeper. The smaller the anisotropic magnetic field Hk, the better. In other words, in the magnetic sensor 1, it is preferable that the sensitivity Zmax/Zb is high, and for this, it is preferable that the anisotropic magnetic field Hk is small. The magnetic field Hb is referred to as a bias magnetic field in some cases. Hereinafter, the magnetic field Hb is referred to as the bias magnetic field Hb.

Magnetic Permeability µ of Soft Magnetic Material Layer 101

When an alternating current is supplied to a soft magnetic material, the cross section of the passage of the current is determined by the skin depth δ due to the skin effect. The skin depth δ is represented by Expression (2). In Expression (2), µ is the resistivity of the soft magnetic material, ω is the angular frequency of the alternating current, and µ is the magnetic permeability.

[Math. 2]

$$\delta = \sqrt{\frac{2\rho}{\omega\mu}} \qquad (2)$$

Here, the magnetic permeability µ in the direction perpendicular to the current changes with the magnetic field H. Since the skin depth δ changes with the change in the magnetic permeability µ, the resistance of the soft magnetic material also changes. In addition, with the change in the magnetic permeability µ, the inductance of the soft magnetic material (internal inductance µl/8π) also changes. Here, l is the length of the soft magnetic material. In other words, the impedance Z of the soft magnetic material is changed by the magnetic field H. In other words, the effect of the skin effect causing the impedance Z to change by the magnetic field is the magnetic impedance effect.

Therefore, in the soft magnetic material, as the change $\Delta\mu$ in the magnetic permeability µ by the change in the magnetic field $\Delta H$ is increased, that is, as the magnetic permeability change rate $\Delta\mu/\Delta H$ by the magnetic field H is increased, the change $\Delta Z$ in the impedance Z by the change in the magnetic field $\Delta H$ is also increased. In other words, for the sensitive part 31 of the sensitive element 30, it is preferable to use a soft magnetic material with a large change $\Delta\mu$ in the magnetic permeability µ due to the change $\Delta H$ in the magnetic field H.

A soft magnetic material with a large initial magnetic permeability µi is considered to have a large change $\Delta\mu$ in the magnetic permeability µ due to the change $\Delta H$ in the magnetic field H. Therefore, in the magnetic sensor 1 to which the exemplary embodiment is applied, an amorphous alloy with a large initial magnetic permeability µi is used as the soft magnetic material layer 101 of the sensitive element 30; thereby the sensitivity of the magnetic sensor 1 is improved.

Example

As an example, an amorphous alloy mainly composed of Co, with initial magnetic permeability μi of about 100,000, was used for the soft magnetic material layer 101 of the sensitive element 30 in the magnetic sensor 1. The amorphous alloy mainly composed of Co also contains 1.4 at % Fe, 13.8 at % Si, 3.6 at % Mn, 5 at % Cr, and 9.5 at % B. In other words, the amorphous alloy mainly composed of Co is $Co_{66.7}Fe_{1.4}Cr_5Mn_{3.6}Si_{13.8}B_{9.5}$. In the following, the amorphous alloy mainly composed of Co is referred to as the Co amorphous alloy CoFeCrMnSiB.

Here, in the sensitive element 30, it was assumed that the number of sensitive parts 31 was 24, the width W of the sensitive part 31 was 100 μm, and the spacing G between the sensitive parts 31 was 50 μm. Then, the thicknesses of the respective soft magnetic material layers 101a, 101b, 101c, and 101d (refer to FIG. 1B) were set at three levels of 250 nm, 500 nm, and 750 nm.

In addition, the length L of the sensitive part 31 was set at three levels of 3 mm, 4 mm, and 5 mm.

The magnetic domain suppression layers 102a and 102b (refer to FIG. 1B) are composed of CrTi with an atomic ratio of 1:1. The thickness of each of the magnetic domain suppression layers 102a and 102b was set at 25 nm.

The conductor layer 103 (refer to FIG. 1B) is composed of Ag. The thickness of the conductor layer 103 was set at 400 nm.

Comparative Example

The configuration of the magnetic sensor 1' of a comparative example is similar to the magnetic sensor 1 shown in FIGS. 1A and 1B to which the exemplary embodiment is applied. Consequently, in FIGS. 1A and 1B, the magnetic sensor 1' is denoted as 1 (1'). The constituents of the magnetic sensor 1' will be described by using the same reference signs as the magnetic sensor 1.

In the magnetic sensor 1' of the comparative example, an amorphous alloy mainly composed of Co, with initial magnetic permeability μi of about 4,800, was used for the soft magnetic material layer 101 of the sensitive element 30. The amorphous alloy mainly composed of Co also contains 17 at % Nb and 3 at % Zr. In other words, the amorphous alloy mainly composed of Co is $Co_{80}Nb_{17}Zr_3$. In the following, the amorphous alloy mainly composed of Co is referred to as the Co amorphous alloy CoNbZr. The thickness of each of the soft magnetic material layers 101a, 101b, 101c, and 101d (refer to FIG. 1B) composed of the Co amorphous alloy CoNbZr was set at 500 nm. Note that the magnetic domain suppression layer 102 and the conductor layer 103 of the comparative example are the same as those of the example.

Figure 3A:
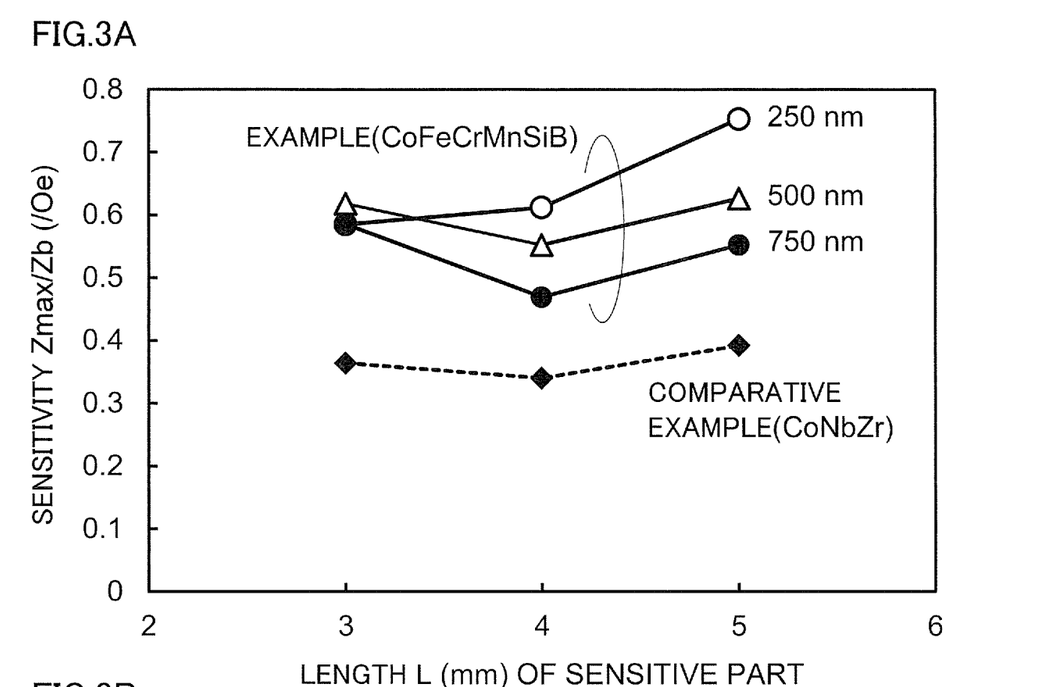
FIGS. 3A and 3B show sensitivity and an anisotropic magnetic field of the magnetic sensor in an example and a comparative example, where
Figure 3B:
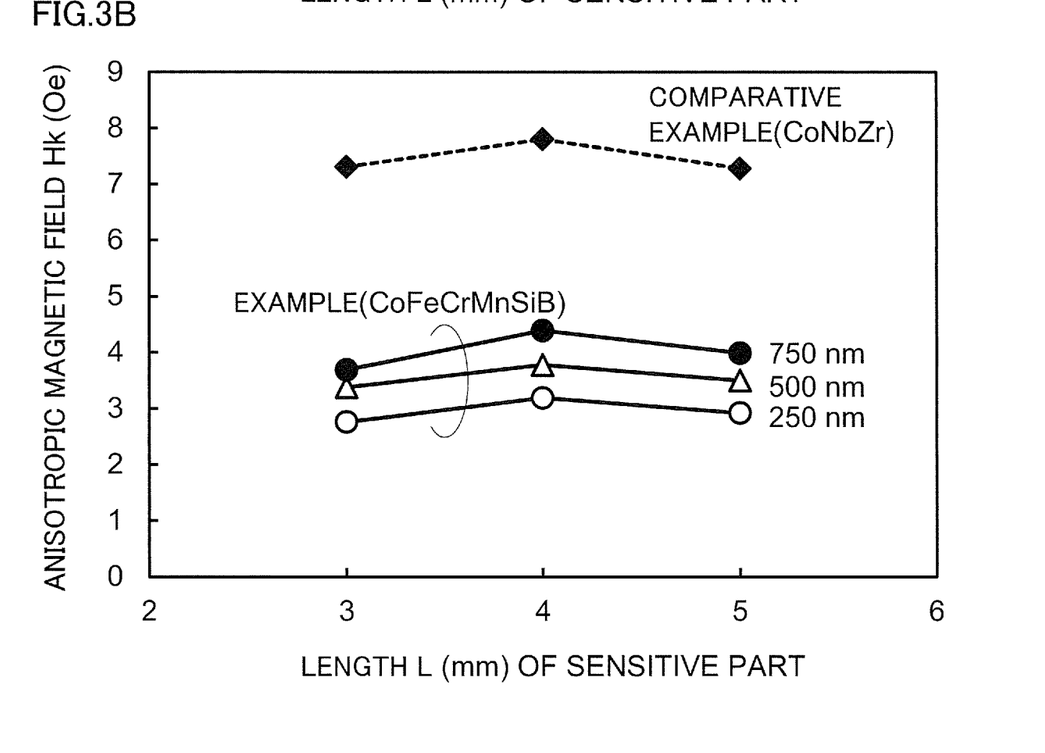

Sensitivity Zmax/Zb and Anisotropic Magnetic Field Hk in Example and Comparative Example FIGS. 3A and 3B show the sensitivity Zmax/Zb and the anisotropic magnetic field Hk of the magnetic sensor 1 in the example and the comparative example. FIG. 3A shows the sensitivity Zmax/Zb, and FIG. 3B shows the anisotropic magnetic field Hk. In FIG. 3A, the vertical axis indicates the sensitivity Zmax/Zb (/Oe), and the horizontal axis indicates the length L (mm) of the sensitive part 31 (in FIG. 3A, denoted as LENGTH L (mm) OF SENSITIVE PART). In FIG. 3B, the vertical axis indicates the anisotropic magnetic field Hk (Oe), and the horizontal axis indicates the length L (mm) of the sensitive part 31. In FIGS. 3A and 3B, the magnetic sensor 1 using the Co amorphous alloy CoFeCrMnSiB as the soft magnetic material layer 101 of the example is denoted as EXAMPLE (CoFeCrMnSiB), and the magnetic sensor 1' using the Co amorphous alloy CoNbZr as the soft magnetic material layer 101 of the comparative example is denoted as COMPARATIVE EXAMPLE (CoNbZr). Note that, in both the example and the comparative example, the frequency of the alternating current supplied to the sensitive element 30 is 50 MHz.

As shown in FIG. 3A, in the example where the Co amorphous alloy CoFeCrMnSiB is used as the soft magnetic material layer 101, although variation is caused due to the thickness of the soft magnetic material layer 101 and the length L of the sensitive part 31, the sensitivity Zmax/Zb is 0.45/Oe to 0.75/Oe. Note that, when the length L of the sensitive part 31 is short (here, L is 3 mm), the sensitivity Zmax/Zb is less dependent on the thickness of the soft magnetic material layer 101.

On the other hand, in the comparative example using the Co amorphous alloy CoNbZr as the soft magnetic material layer 101, the sensitivity Zmax/Zb is 0.35/Oe to 0.40/Oe, which is less dependent on the length L of the sensitive part 31.

In other words, the sensitivity Zmax/Zb in the example using the Co amorphous alloy CoFeCrMnSiB as the soft magnetic material layer 101 is, with any thickness, higher than the sensitivity Zmax/Zb in the comparative example using the Co amorphous alloy CoNbZr as the soft magnetic material layer 101.

As shown in FIG. 3B, in the example where the Co amorphous alloy CoFeCrMnSiB is used as the soft magnetic material layer 101, the anisotropic magnetic field Hk is 3 Oe to 4 Oe, which is less dependent on the length L of the sensitive part 31. Then, the anisotropic magnetic field Hk tends to be small as the thickness of the soft magnetic material layer 101 is reduced (here, the thickness is 250 nm).

On the other hand, in the comparative example where the Co amorphous alloy CoNbZr is used as the soft magnetic material layer 101, the anisotropic magnetic field Hk is about 7 Oe, which is also less dependent on the length L of the sensitive part 31.

In other words, the anisotropic magnetic field Hk in the example using the Co amorphous alloy CoFeCrMnSiB as the soft magnetic material layer 101 is, with any thickness, smaller than the anisotropic magnetic field Hk in the comparative example using the Co amorphous alloy CoNbZr as the soft magnetic material layer 101.

As described above, in the example using the Co amorphous alloy CoFeCrMnSiB as the soft magnetic material layer 101, the sensitivity Zmax/Zb is high and the anisotropic magnetic field Hk is small as compared to the comparative example using the Co amorphous alloy CoNbZr as the soft magnetic material layer 101. This is considered because the Co amorphous alloy CoFeCrMnSiB with the initial magnetic permeability of about 100,000 μi is used as the soft magnetic layer 101 in the example, whereas the Co amorphous alloy CoNbZr with the initial magnetic permeability of about 4,800 μi is used as the soft magnetic material layer 101 in the comparative example. In other words, it is estimated that the use of the soft magnetic material with a high initial magnetic permeability μi increased the change in the magnetic permeability μ with respect to the magnetic field H, and thereby the change in the impedance Z was increased.

In the above, the Co amorphous alloy CoFeCrMnSiB with the initial magnetic permeability μi of about 100,000 was used as the soft magnetic material layer 101, but the initial magnetic permeability pi does not necessarily have to be about 100,000. For example, the initial magnetic permeability $\mu i$ of the soft magnetic material used for the soft magnetic material layer 101 may be 5,000 or more. In addition, the initial magnetic permeability $\mu i$ of the soft magnetic material used for the soft magnetic material layer 101 $\mu i$ is preferably 10,000 or more, and more preferably 50,000 or more.

In the above example, the Co amorphous alloy CoFeCrMnSiB was used as the soft magnetic material layer 101. Here, an amorphous alloy mainly composed of Co, which was obtained by excluding Cr and Mn from the Co amorphous alloy CoFeCrMnSiB was studied as the soft magnetic material layer 101. The amorphous alloy mainly composed of Co contains Co as the main component, and further contains 10 at % Fe, 10 at % Si, and 10 at % B. In other words, the amorphous alloy mainly composed of Co is $Co_{70}Fe_{10}Si_{10}B_{10}$. The amorphous alloy mainly composed of Co is referred to as the Co amorphous alloy CoFeSiB.

In a magnetic sensor using the Co amorphous alloy CoFeSiB as the soft magnetic material layer 101, the sensitivity Zmax/Zb is low and the anisotropic magnetic field Hk is large as compared to the magnetic sensor shown as the comparative example using the Co amorphous alloy CoNbZr as the soft magnetic material layer 101.

From this, it is considered that, in the example, the sensitivity Zmax/Zb as the magnetic sensor 1 was improved and the anisotropic magnetic field Hk was reduced because the Co amorphous alloy CoFeCrMnSiB used as the soft magnetic material layer 101 contained Cr and Mn. It is known that Cr has the effect of improving corrosion resistance and abrasion resistance. Consequently, it is estimated that, by containing Mn, the sensitivity Zmax/Zb as the magnetic sensor 1 was improved and the anisotropic magnetic field Hk was reduced.

Modified Example

Figure 4A:
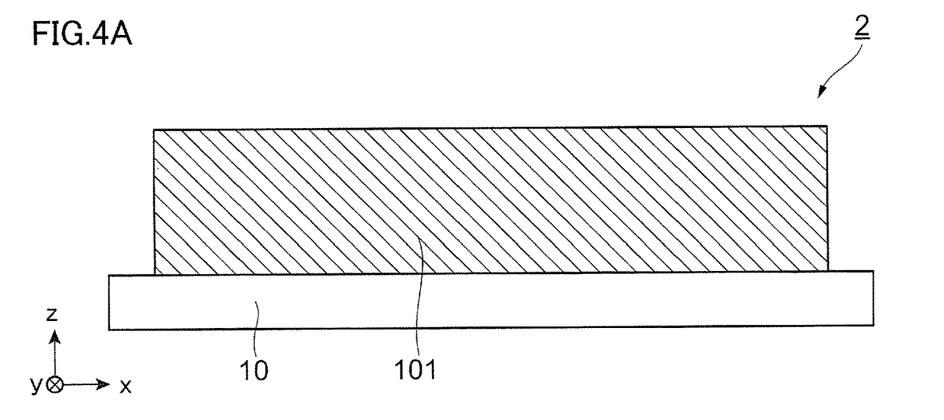
FIG. 4A shows a magnetic sensor including a sensitive part in a sensitive element, the sensitive part being configured with a single soft magnetic material layer.
Figure 4B:
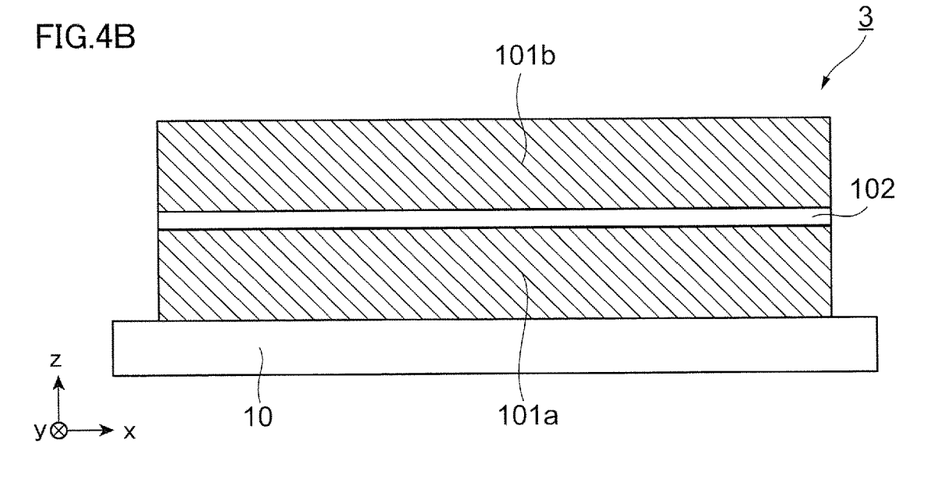
FIG. 4B shows a magnetic sensor including a sensitive part in a sensitive element, the sensitive part being configured with two soft magnetic material layers with a magnetic domain suppression layer interposed therebetween.
Figure 4C:
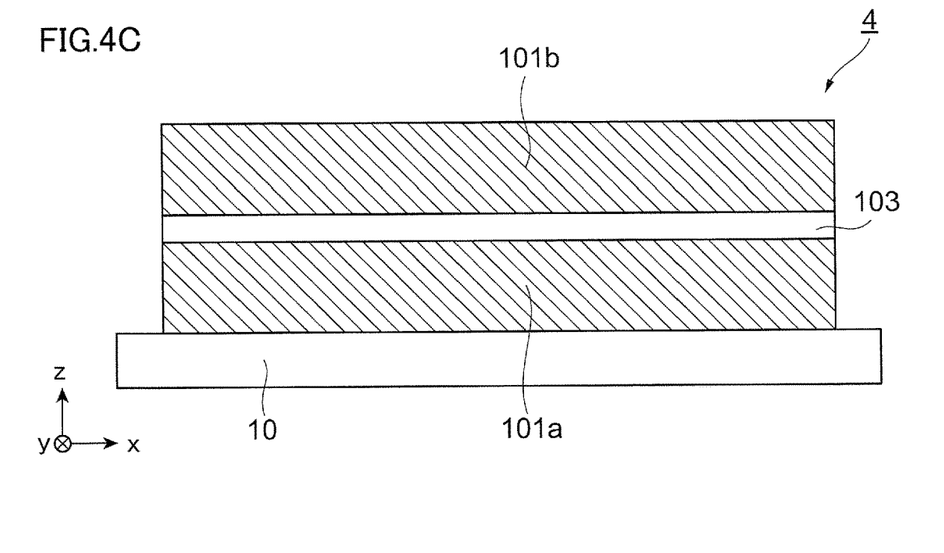
FIG. 4C shows a magnetic sensor including a sensitive part in a sensitive element, the sensitive part being configured with two soft magnetic material layers with a conductor layer interposed therebetween.

FIGS. 4A to 4C show cross-sectional views of modified examples of the magnetic sensor 1. FIG. 4A shows a magnetic sensor 2 including the sensitive part 31 in the sensitive element 30, the sensitive part 31 being configured with a single soft magnetic material layer 101, FIG. 4B shows a magnetic sensor 3 including the sensitive part 31 in the sensitive element 30, the sensitive part 31 being configured with two soft magnetic material layers 101 with the magnetic domain suppression layer 102 interposed therebetween, and FIG. 4C shows a magnetic sensor 4 including the sensitive part 31 in the sensitive element 30, the sensitive part 31 being configured with two soft magnetic material layers 101 with the conductor layer 103 interposed therebetween. Note that, in FIGS. 4A, 4B, and 4C, portions similar to those of the magnetic sensor 1 shown in FIGS. 1A and 1B are assigned with the same reference signs. The soft magnetic material layer 101 is configured with the soft magnetic material with the initial magnetic permeability $\mu i$ of 5,000 or more.

The sensitive part 31 may be configured with a single soft magnetic material layer 101 as shown in FIG. 4A, may be configured with two soft magnetic material layers 101 with the magnetic domain suppression layer 102 interposed therebetween as shown in FIG. 4B, or may be configured with two soft magnetic material layers 101 with the conductor layer 103 interposed therebetween as shown in FIG. 4C. In addition, the sensitive part 31 may be provided by three or more soft magnetic material layers 101.

Moreover, instead of the magnetic domain suppression layer 102 in FIG. 4B, an antiferromagnetically coupling layer that antiferromagnetically couples the upper and lower soft magnetic material layers 101 may be used. Also, the magnetic domain suppression layers 102a and 102b in the magnetic sensor 1 shown in FIGS. 1A and 1B may serve as the antiferromagnetically coupling layers. As described above, the magnetic domain suppression layer 102 suppresses the occurrence of the closure magnetic domains, and antiferromagnetically couples the upper and lower soft magnetic material layers 101. The antiferromagnetically coupling layer has no function of suppressing the occurrence of the closure magnetic domains or has weak function of suppressing the occurrence of the closure magnetic domains. In the case where the antiferromagnetically coupling layer is included, the antiferromagnetically-coupled upper and lower soft magnetic material layers 101 suppress the demagnetizing field, to thereby improve the sensitivity Zmax/Zb of the magnetic sensor. Specific examples of materials of such an antiferromagnetically coupling layer include Ru or an Ru alloy.

The sensitive part 31 may include plural layers of the magnetic domain suppression layer 102, the conductor layer 103, and the antiferromagnetically coupling layer.

Further, in the magnetic sensors 1 to 4, a magnet (hereinafter, referred to as a thin film magnet) configured with a hard magnetic material layer and applying the bias magnetic field Hb (refer to FIG. 2) may be provided between the substrate 10 and the sensitive element 30. The thin film magnet may be provided so that the north and south magnetic poles are disposed to pass the magnetic flux in the longitudinal direction of the sensitive part 31 in the sensitive element 30. Note that, even in the case where the thin film magnet is provided between the substrate 10 and the sensitive element 30, the substrate 10 and the thin film magnet are collectively referred to as a substrate in some cases.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor comprising:
   a non-magnetic substrate; and
   a sensitive element including a soft magnetic material layer composed of an amorphous alloy with an initial magnetic permeability of 5,000 or more, the soft magnetic material layer being provided on the substrate, having a longitudinal direction and a short direction, being provided with uniaxial magnetic anisotropy in a direction crossing the longitudinal direction, and sensing a magnetic field by a magnetic impedance effect.

2. The magnetic sensor according to claim 1, wherein the soft magnetic material layer has an initial magnetic permeability of 10,000 or more.

3. The magnetic sensor according to claim 1, wherein the soft magnetic material layer is an amorphous alloy mainly composed of Co and also containing Fe, Si, B, and Mn.

4. The magnetic sensor according to claim 1, wherein the soft magnetic material layer is an amorphous alloy mainly composed of Co and also containing Fe, Si, B, Mn, and Cr.

5. The magnetic sensor according to claim 1, wherein
the sensitive element includes a plurality of the soft magnetic material layers, and
the sensitive element includes a magnetic domain suppression layer between the soft magnetic material layers, the magnetic domain suppression layer suppressing occurrence of a closure magnetic domain in the soft magnetic material layers.

6. The magnetic sensor according to claim 1, wherein
the sensitive element comprises a plurality of the soft magnetic material layers, and
the sensitive element includes a non-magnetic conductor layer between the soft magnetic material layers, the non-magnetic conductor layer having higher conductivity than the soft magnetic material layers.

7. The magnetic sensor according to claim 1, wherein
the sensitive element includes a plurality of the soft magnetic material layers, and
the sensitive element includes a non-magnetic antiferromagnetically coupling layer between the soft magnetic material layers, the antiferromagnetically coupling layer antiferromagnetically coupling the soft magnetic material layers.

* * * * *